(12) United States Patent
Cheng et al.

(10) Patent No.: US 8,847,184 B2
(45) Date of Patent: Sep. 30, 2014

(54) COMPOSITE FILM FOR BOARD LEVEL EMI SHIELDING

(71) Applicant: Henkel Corporation, Rocky Hill, CT (US)

(72) Inventors: Chih-Min Cheng, Westford, MA (US); Bo Xia, Irvine, CA (US); George Thomas, Bergenfield, NJ (US)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

(21) Appl. No.: 13/798,895

(22) Filed: Mar. 13, 2013

(65) Prior Publication Data

US 2013/0207005 A1     Aug. 15, 2013

Related U.S. Application Data

(63) Continuation of application No. PCT/US2011/057418, filed on Oct. 24, 2011.

(60) Provisional application No. 61/406,705, filed on Oct. 26, 2010.

(51) Int. Cl.
*G21F 1/00* (2006.01)

(52) U.S. Cl.
USPC .............. 250/515.1; 324/750.26; 324/750.27; 427/96.3

(58) Field of Classification Search
USPC .................... 250/515.1; 324/750.26, 750.27; 427/96.3
See application file for complete search history.

(56) References Cited

U.S. PATENT DOCUMENTS

| | | | |
|---|---|---|---|
| 5,639,989 A | 6/1997 | Higgins, III | |
| 8,156,644 B2 * | 4/2012 | Babb et al. | 29/841 |
| 2006/0247352 A1 * | 11/2006 | Bormashenko et al. | 524/408 |
| 2007/0071886 A1 | 3/2007 | Babb et al. | |
| 2010/0315105 A1 * | 12/2010 | Fornes | 324/693 |

FOREIGN PATENT DOCUMENTS

| | | |
|---|---|---|
| WO | 2006121194 A1 | 11/2006 |
| WO | 2006132695 A2 | 12/2006 |

OTHER PUBLICATIONS

EMC & RFI Products brochure. Retrieved from http://solutions.3m.co.uk/3MContentRetrievalAPI/BlobServlet?lmd=1215523005000&locale=en_GB&univid=1168406443506&fallback=true&assetType=MMM_Image&blobAttribute=ImageFile&placeId=7BC6E48B1800BAE180A88EBDDE34DE66&version=current on Feb. 2009, 3M, pp. 1-18.

* cited by examiner

*Primary Examiner* — Nikita Wells
(74) *Attorney, Agent, or Firm* — Steven C. Bauman

(57) ABSTRACT

An EMI shielding composite film for use in printed circuit boards has at least two layers, a top layer electrically conductive in all directions (isotropic), and a bottom layer electrically conductive only in the Z (thickness) direction (anisotropic) after thermo-compression. The bottom layer is in contact with the grounding pads of the circuitry of the electronic device to be shielded. The conductive top layer functions similarly to metallic boxes to prevent the electromagnetic radiation from both entering the boxes and escaping into the environment. The bottom layer interconnects the top conductive layer to the grounding pads on the PCB after thermo-compression so that electromagnetic waves collected by the top layer are directed and released to PCB grounding pads through the bottom layer.

15 Claims, No Drawings

COMPOSITE FILM FOR BOARD LEVEL EMI SHIELDING

BACKGROUND OF THE INVENTION

This invention relates to a film for shielding electronic devices, such as, computers, communication devices, printers, video cameras, and the like, from emitting electromagnetic radiation (EMI).

Electronic devices emit electromagnetic radiation that can interfere with television, radio, and other communications. The level of EMI is regulated by governments, and consequently the manufacturers of electronic devices are required to limit the level of EMI produced by their devices. A second reason for limiting EMI is that stray signals within a device can cause internal interference or cross-talk. Two approaches are used currently to limit EMI: suppressing the electromagnetic radiation at the source, or containing the radiation so that it does not escape the device.

Containment can be accomplished per Faraday's principle by enclosing the emitting device in a perfectly conducting shield, such as, a metallic can or a conformal coating. However, the metallic can is less than optimum because there are always areas from which radiation can escape, it adds cost and weight to the electronic device, and it is not suitable for a flexible substrate. Moreover, if rework is needed, the metallic can must be de-soldered and then re-soldered, which increases the risk of damaging active devices.

Conformal coatings also have disadvantages. They are typically applied in multiple layers, a dielectric insulating layer and a conductive layer, which require multiple processing steps. The conductive layer is usually applied as a liquid ink and if not carefully controlled may lead to deposition in an undesired area and cause shorts in the circuitry. The drying/curing time for printed conductive inks is in the range of 10 to 30 minutes, longer than desired, and conductive inks may contain volatile organic solvent. The dielectric layer is interposed between the conductive layer and the circuitry to prevent the conductive layer from electrically contacting predetermined areas of the circuitry and substrate.

In order to overcome the current disadvantages of EMI shielding, the instant invention is disclosed and claimed.

SUMMARY OF THE INVENTION

This invention is a composite film, which shields for EMI, for use in fabricating printed circuit boards (PCB). The film has at least two layers, a top layer electrically conductive in all directions (isotropic), and a bottom layer electrically conductive only in the Z (thickness) direction (anisotropic) after thermo-compression. (Thermo-compression is the application of heat and pressure.) The bottom layer is in contact with the grounding pads of the circuitry of the electronic device. The conductive top layer functions similarly to metallic boxes to prevent the electromagnetic radiation from both entering the boxes and escaping into the environment. The bottom layer interconnects the top conductive layer to the grounding pads on the PCB after thermo-compression so that electromagnetic waves collected by the top layer are directed and released to PCB grounding pads through the bottom layer.

The level of conductive filler in the bottom layer is below the level that would cause electrical shorting in the circuitry of the device without the application of thermo-compression. That is, for those areas of the substrate and circuitry outside of the grounding pads and consequently not subject to thermo-compression processing, the conductive filler in the bottom layer is at too low a level to allow conductance. However, when thermo-compression processing is applied to localized areas, the pressure and heat at those localized areas cause the conductive fillers in those localities to sinter and interconnect, thereby allowing the connection of the active device to the top conductive layer. The level of thermo-compression is an effective level to cause the interconnection of the conductive filler particles between the top layer and the bottom layer.

The conductive top layer functions similarly to metallic cans or metal cases, and contains an effective amount of conductive filler to prevent the ingress or egress of electromagnetic radiation (without thermo-compression).

DETAILED DESCRIPTION OF THE INVENTION

The top layer of the EMI shielding film can be composed in alternative embodiments establishing isotropic conductivity. In one embodiment the top layer comprises a polymeric resin filled with conductive particles at a loading level effective to establish isotropic conductivity. The polymeric resin comprises at least one thermoset resin, and/or at least one thermoplastic resin. Exemplary suitable thermoset resins include vinyl, acrylic, phenolic, epoxy, maleimide, polyimide, or silicon-containing resins. Exemplary suitable thermoplastic resins include acrylics, phenoxy resins, thermoplastic polyesters, polyamides, polyurethanes, polyolefins, polysulfide rubbers, and nitrile rubbers.

The conductive filler particles for the top layer can be any effective filler at any effective loading to provide isotropic conductivity. Suitable fillers include silver, nickel, copper, graphite, carbon nanotubes, or core/shell particles. If core/shell particles are used, the core can be an inorganic particle, such as silica, glass, boron nitride, or metal, or it can be an organic resin, such as polyethylene, polystyrene, phenol resin, epoxy resin, acryl resin or benzoguanamine resin; the shell can be a conductive element such as silver, nickel, or copper.

Suitable conductive filler loading levels are 15 volume percent or greater, depending on the shape and size of the conductive fillers, with respect to the total composition of the top layer. Silver coated copper (Ag/Cu) is suitable.

In another embodiment, the top layer can be a metal foil or a metal mesh, such as, for example, copper or aluminum. In a further embodiment, the top layer can be a combination of a metal foil or metal mesh and the polymeric resin filled with conductive particles.

The bottom layer of the EMI shielding film will be sufficiently adhesive to connect the composite film to the EMI shielded components or substrate. The bottom layer comprises an adhesive polymeric resin filled with conductive particles at a loading level effective to establish anisotropic conductivity upon the application of thermo-compression. The bottom layer polymeric resin comprises at least one thermoset resin, and/or at least one thermoplastic resin. Exemplary suitable thermoset resins include vinyl, acrylic, phenolic, epoxy, maleimide, polyimide, or silicon-containing resins. Exemplary suitable thermoplastic resins include acrylics, phenoxy resins, thermoplastic polyesters, polyamides, polyurethanes, polyolefins, polysulfide rubber, and nitrile rubbers.

The conductive fillers for the bottom layer are loaded typically at 2 to 20 volume percent (vol %) with respect to the total composition of the bottom layer. In one embodiment, the conductive filler for the bottom layer is present in an amount of about 1 to about 5 volume percent.

At loadings within this range, the particles are sufficiently dispersed in the polymeric resin so as not to contact each other laterally, thus avoiding x-y conductivity. The bottom layer filler particle diameter is selected to be smaller than the bottom layer thickness. Suitable particle diameters are in the range of 1 μm to 125 μm. Suitable bottom layer fillers include silver, copper, nickel, and graphite. Conductive filler with conductive shell and conductive or dielectric core can also be used. Examples include gold coated polymer spheres, Ag coated silicate, tungsten carbide (WC) coated aluminum, and graphite coated metal. Other suitable bottom layer fillers include silver, copper, nickel, and graphite with a dielectric outer coating to further ensure no possibility of circuitry shorting. If such a dielectric outer coating is used, it should be selected to breakup easily with pressure or melt away with heat, so that when thermo-compression is applied in localized areas, conductive interconnections can be formed.

In addition to the electrically conductive fillers, the bottom layer may also contain thermally conductive but electrically non-conductive (dielectric) fillers to enhance thermal conductivity of the package. Exemplary thermally conductive dielectric fillers include boron nitride, aluminum oxide, aluminum nitride, and particles coated with these materials. When thermally conductive dielectric fillers are present, they are present in the range of 10 weight percent to 80 weight percent (wt %) with respect to the total composition of the bottom layer. The thermally conductive dielectric fillers (or other functional non-conductive fillers) will have a maximum particle size smaller than the particle size of the conductive fillers in the bottom layer.

In one method of preparation of the bottom layer, hot melt resins are homogenized with conductive fillers (for example, using a heated compounding machine). This hot melt mixture is extruded through a slot die to a given thickness and the extruded film calendared further for reduced thickness.

In another method of preparation of the bottom layer, the bottom layer is prepared from one or more solvent-free liquid B-stageable thermoset resins or a combination of thermoset and thermoplastic resins. Conductive fillers are dispersed into the liquid resins using conventional mixing vessels and blades. The mixture is disposed directly onto the top layer, or disposed onto a release liner. Using heat or UV radiation, the bottom layer is cured to form a B-staged coating or film. If the bottom layer mixture is disposed onto a release liner, after B-staging it is contacted to the top layer, the bottom and top layers are laminated, and the release liner is removed. This bottom layer will be further crosslinked to provide a reliable interconnect during the thermo-compression process occurring in the EMI assembly, or later if there is a post-cure step.

Alternatively, the bottom layer can be prepared from a solvent based thermoplastic or thermoset resin system. Conductive fillers are dispersed in the solvent and resin mixture using conventional mixing vessels and blades. The mixture is disposed onto the top layer or disposed onto a release liner, followed by solvent evaporation to form a film. If the mixture is disposed onto a release liner, after solvent evaporation and film formation, the bottom layer is contacted to the top layer, the layers are laminated, and the release liner is later removed.

In another embodiment, the bottom layer can be prepared as a composite of different layers in which, for example, the first layer is a film prepared from a reactive resin, and the second layer is a film prepared from a curing agent; optionally, a third layer prepared from an inert material can be inserted between the first and second layer to prevent prereaction between those layers, thereby enhancing the shelf life of the composite bottom layer film.

In all embodiments for the bottom layer disclosed herein, the bottom layer will be substantially dry to the touch after solvent evaporation, after thermal or UV B-staging, or after hot melt extrusion and cooling.

The composite film of top layer and bottom layer is prepared by laminating the conductive top layer to the bottom layer, or by coating the bottom layer directly onto the top layer. In one embodiment, the bottom layer thickness will be 50 μm or greater, and the top layer thickness will be between 10-100 μm, depending on requirements for film conductivity and shielding effectiveness. In some embodiments, a third pressure-sensitive-layer can be added below the bottom layer to control positioning during assembly processes. The composite film can be slit to the desired width and cut to the desired length, and can be packaged on a reel.

Utilization of the composite film as an EMI shield for printed circuit boards (PCB) can occur in several embodiments. In one embodiment, after all the PCB components are soldered and functional testing has been completed, the EMI shield composite film is picked-up and placed on top of the PCB. The film is softened by heating the assembly from the top and/or bottom to a temperature 30° to 50° C. above the softening temperature of the composite film. The softened film will conform to the contour of the components needing EMI shielding protection. A hot air stream or a heated metal block with contours matching the PCB layout can be used as the heat source. Interconnects between the conductive top layer to the PCB ground pads is established by thermo-compression, that is, by thermally compressing the composite film to the PCB ground pad with a heated source, such as, a heated metal bar or a high pressure hot air stream. In one embodiment, the film softening/conforming and interconnect are done in a single step.

In a further embodiment, if functional testing of the PCB is not required before application of the EMI shielding composite film, the composite film can be picked-up and placed to the desired substrate and the softening/conforming step can be done together with solder reflow and electrical connection of all the components. During the cooling period after the solder reflow process, a metal bar can be used to establish the interconnect as described above. This assembly scenario is fully compatible with the current metallic can process.

In another embodiment, if the choice of filler is one that is sharp and hard, for example, tungsten carbide coated aluminum, and the bottom dielectric film has proper softness at room temperature, then a cold stamping process, followed by heat curing the dielectric resin, can be used to make the interconnect between the top conductive layer and PCB ground pads. The heat cure following the cold stamping secures the interconnect and provides strong adhesion. In this case the thermo-compression step is not needed.

In one embodiment, a catalyst or accelerator can be dispensed to the PCB ground pad before placement of the EMI shielding composite film to further improve the cure speed of the bottom layer.

The proposed composite film may be cramped into a wavy format. The advantage of a wavy format film compared to a flat format film is to provide expansion, which better accommodates any three dimensional electronic components underneath the EMI composite film.

The invention claimed is:

1. A composite film for EMI shielding having at least two layers, a top layer electrically conductive in all directions (isotropic), and a bottom layer electrically conductive only in the Z direction (anisotropic) after thermo-compression.

2. The composite film according to claim 1 in which the top layer comprises a polymeric resin filled with conductive filler particles at a loading level effective to establish isotropic conductivity.

3. The composite film according to claim 2 in which the top layer polymeric resin comprises at least one thermoset resin, or at least one thermoplastic resin, or a combination of thermoset and thermoplastic resins.

4. The composite film according to claim 3 in which the top layer thermoset resins are selected from the group consisting of vinyl, acrylic, phenolic, epoxy, maleimide, polyimide, or silicon-containing resins, and the top layer thermoplastic resins are selected from the group consisting of acrylics, phenoxy resins, thermoplastic polyesters, polyamides, polyurethanes, polyolefins, polysulfide rubber, and nitrile rubbers.

5. The composite film according to claim 2 in which the top layer conductive filler particles are selected from the group consisting of silver, nickel, copper, graphite, carbon nanotubes, and core/shell particles,
   in which core/shell particles the core is selected from the group consisting of silica, glass, boron nitride, metal, polyethylene, polystyrene, phenol resin, epoxy resin, acryl resin and benzoguanamine resin and the shell is selected from the group consisting of silver, nickel, and copper.

6. The composite film according to claim 1 in which the top layer conductive filler loading is 15 volume percent or greater with respect to the total composition of the top layer.

7. The composite film according to claim 1 in which the top layer is a metal foil or a metal mesh, or a combination of a metal foil or a metal mesh and a polymeric resin filled with conductive particles.

8. The composite film according to claim 1 in which the bottom layer comprises an adhesive polymeric resin filled with conductive particles at a loading level effective to establish anisotropic conductivity upon the application of thermocompression.

9. The composite film according to claim 8 in which the bottom layer polymeric resin comprises at least one thermoset resin, or at least one thermoplastic resin, or a combination of thermoset and thermoplastic resins, in which the bottom layer is substantially dry to the touch.

10. The composite film according to claim 9 in which the bottom layer thermoset resins are selected from the group consisting of vinyl, acrylic, phenolic, epoxy, maleimide, polyimide, and silicon-containing resins and the bottom layer thermoplastic resins are selected from the group consisting of acrylics, phenoxy resins, thermoplastic polyesters, polyamides, polyurethanes, polyolefins, polysulfide rubber, and nitrile rubbers.

11. The composite film according to claim 8 in which the bottom layer conductive filler loading level is 2 to 20 volume percent with respect to the total composition of the bottom layer.

12. The composite film according to claim 8 in which the bottom layer conductive filler particle diameter is within the range of 1 μm to 125 μm.

13. The composite film according to claim 8 in which the bottom layer conductive filler is selected from the group consisting of silver, copper, nickel, graphite, and core shell particles,
   in which the core/shell particles have a conductive shell and a conductive or dielectric core.

14. The composite film according to claim 13 in which the bottom layer conductive filler is core/shell particles selected from the group consisting of gold coated polymer spheres, silver coated silicate, tungsten carbide (WC) coated aluminum, and graphite coated metal.

15. The composite film according to claim 8 in which the bottom layer further comprises dielectric fillers with a particle size smaller than the particle size of the conductive filler, selected from the group consisting of boron nitride, aluminum oxide, aluminum nitride, and particles coated with these materials, and present at a loading level in the range of 10 weight percent to 80 weight percent based on the composition of the bottom layer.

\* \* \* \* \*